(12) United States Patent
Melanson et al.

(10) Patent No.: US 11,798,978 B2
(45) Date of Patent: Oct. 24, 2023

(54) ON-CHIP INDUCTOR WITH AUDIO HEADPHONE AMPLIFIER

(71) Applicant: Cirrus Logic International Semiconductor Ltd., Edinburgh (GB)

(72) Inventors: John L. Melanson, Austin, TX (US); Lei Zhu, Austin, TX (US); Wai-Shun Shum, Austin, TX (US); Xiaofan Fei, Austin, TX (US); Johann G. Gaboriau, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 304 days.

(21) Appl. No.: 17/019,621

(22) Filed: Sep. 14, 2020

(65) Prior Publication Data
US 2021/0175322 A1 Jun. 10, 2021

Related U.S. Application Data

(60) Provisional application No. 62/944,820, filed on Dec. 6, 2019.

(51) Int. Cl.
*H01L 23/52* (2006.01)
*H01L 49/02* (2006.01)
(Continued)

(52) U.S. Cl.
CPC .......... *H01L 28/10* (2013.01); *H01L 23/5227* (2013.01); *H03F 1/0272* (2013.01)

(58) Field of Classification Search
CPC ... H01L 28/10; H01L 23/5227; H03F 1/0272; H03F 2200/03; H03F 2200/321;
(Continued)

(56) References Cited

U.S. PATENT DOCUMENTS 5,905,370 A * 5/1999 Bryson ................. H02M 3/157
 323/283
6,486,924 B1 * 11/2002 Paraskevopoulos ..... H04N 5/44
 348/706
(Continued)

FOREIGN PATENT DOCUMENTS

| GB | 2510394 A * | 8/2014 | ........... H03F 1/0238 |
| GB | 2510394 A | 8/2014 | |
| GB | 2560045 A | 8/2018 | |

OTHER PUBLICATIONS

"TPSM8281x 2.75-V to 6-V Input 4-A and 3-A Step-Down MicroSiP™ Power Module with Integrated Inductor and Frequency Synchronization", Texas Instruments datasheet, Sep. 2019 (TI). (Year: 2019).*
(Continued)

*Primary Examiner* — S M Sohel Imtiaz
(74) *Attorney, Agent, or Firm* — Jackson Walker L.L.P

(57) ABSTRACT

A single integrated circuit may include a signal path configured to generate an output signal from an input signal, wherein the signal path includes an amplifier configured to drive the output signal, a direct-current-to-direct-current (DC-DC) power converter having a power inductor integrated in the single integrated circuit and configured to generate a supply voltage to the amplifier from a source voltage to the DC-DC power converter, and control circuitry for controlling operation of converter switches of the DC-DC power converter in order that the supply voltage tracks at least one among the input signal and the output signal.

16 Claims, 2 Drawing Sheets

(51) Int. Cl.
*H03F 1/02* (2006.01)
*H01L 23/522* (2006.01)

(58) Field of Classification Search
CPC ...... H03F 3/187; H03F 1/0227; H03F 1/0238; Y02B 70/10; H02M 1/0054; H02M 3/158
See application file for complete search history.

(56) References Cited

U.S. PATENT DOCUMENTS

| | | | |
|---|---|---|---|
| 2008/0012638 A1* | 1/2008 | Funaki | H03F 1/0227 330/136 |
| 2014/0042999 A1* | 2/2014 | Barth | H02M 5/293 323/271 |
| 2015/0109056 A1* | 4/2015 | Lesso | H03G 1/0088 330/251 |
| 2015/0188432 A1* | 7/2015 | Vannorsdel | H02M 3/156 323/271 |
| 2018/0248525 A1* | 8/2018 | Orr | G05F 1/575 |
| 2019/0140597 A1* | 5/2019 | Lin | H03F 1/0227 |
| 2019/0165676 A1* | 5/2019 | Nogawa | H02M 3/158 |

OTHER PUBLICATIONS

International Search Report and Written Opinion of the International Searching Authority, International Application No. PCT/US2020/059828, dated Feb. 10, 2021.

John, Varun; "Achieving High Thermal Performance in Compact Buck Power Modules," Feb. 2021.

* cited by examiner

ON-CHIP INDUCTOR WITH AUDIO HEADPHONE AMPLIFIER

RELATED APPLICATION

The present disclosure claims priority to U.S. Provisional Patent Application Ser. No. 62/944,820, filed Dec. 6, 2019, which is incorporated by reference herein in its entirety.

FIELD OF DISCLOSURE

The present disclosure relates in general to circuits for audio devices, including without limitation personal audio devices, such as wireless telephones and media players, and more specifically, to systems and methods relating to an on-chip inductor with an audio headphone amplifier.

BACKGROUND

Mobile devices, including wireless telephones, such as mobile/cellular telephones, cordless telephones, mp3 players, and other consumer audio devices, are in widespread use. Such mobile devices may include circuitry for driving a transducer, including without limitation, a headphone, a speaker, a linear resonant actuator or other vibrational actuator, and/or any other suitable transducer.

In many audio systems, a linear amplifier may drive a transducer, and such linear amplifier may be powered from a variable supply voltage that tracks an envelope of the output signal driven by the linear amplifier to the transducer. For example, a power supply for implementing such variable supply voltage may include a buck converter or other switched-mode power converter, wherein such switched-mode power converter includes an off-chip power inductor. However, disadvantages of many implementations of such a topology is that the switched-mode power converter is unable to switch with sufficient bandwidth to effectively track the output signal driven by the linear amplifier over the full audio bandwidth.

SUMMARY

In accordance with the teachings of the present disclosure, one or more disadvantages and problems associated with existing approaches to implementing an output signal envelope tracking power supply may be reduced or eliminated.

In accordance with embodiments of the present disclosure, a single integrated circuit may include a signal path configured to generate an output signal from an input signal, wherein the signal path includes an amplifier configured to drive the output signal, a direct-current-to-direct-current (DC-DC) power converter having a power inductor integrated in the single integrated circuit and configured to generate a supply voltage to the amplifier from a source voltage to the DC-DC power converter, and control circuitry for controlling operation of converter switches of the DC-DC power converter in order that the supply voltage tracks at least one among the input signal and the output signal.

In accordance with embodiments of the present disclosure, a method may include, in a single integrated circuit generating an output signal from an input signal in a signal path, wherein the signal path includes an amplifier configured to drive the output signal, generating a supply voltage to the amplifier from a source voltage to a direct-current-to-direct-current (DC-DC) power converter, wherein the DC-DC power converter has a power inductor integrated in the single integrated circuit, and controlling operation of converter switches of the DC-DC power converter with control circuitry in order that the supply voltage tracks at least one among the input signal and the output signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
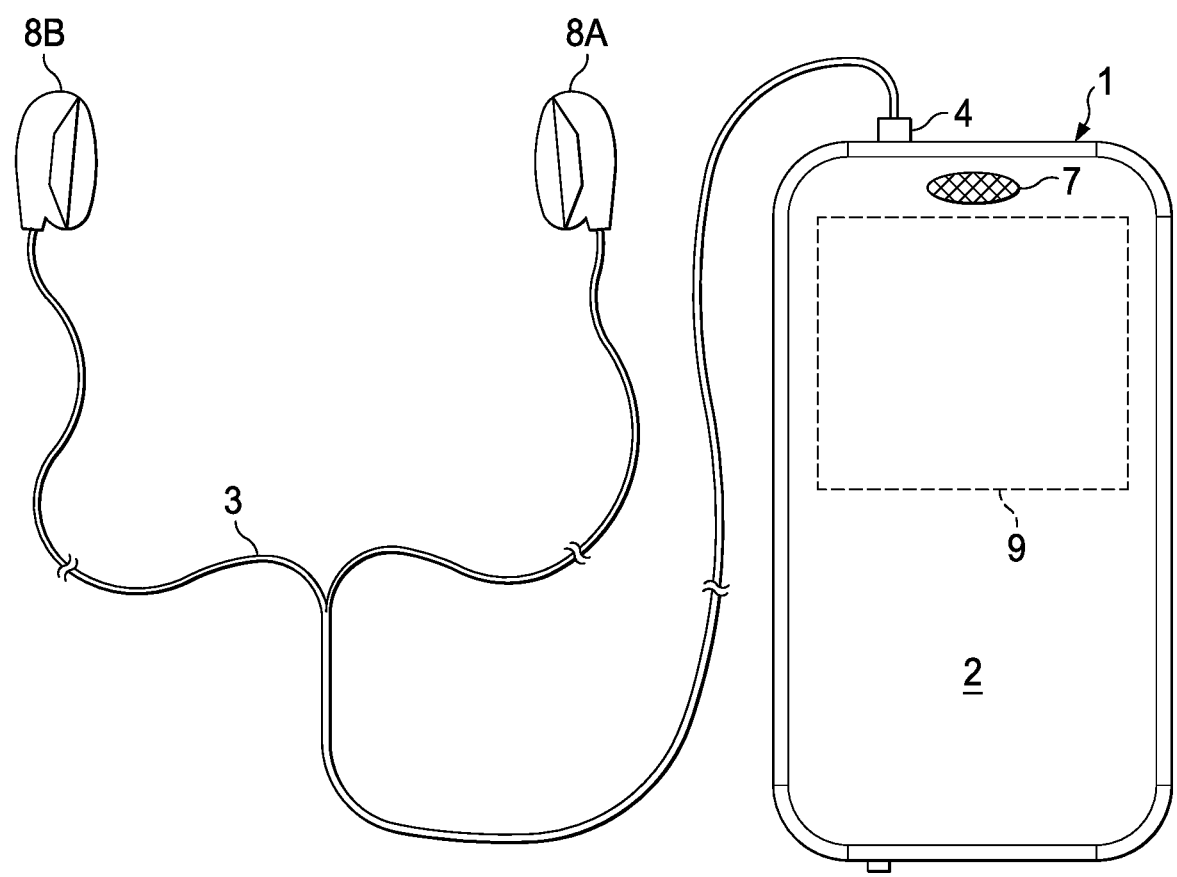
FIG. 1 is an illustration of an example personal audio device, in accordance with embodiments of the present disclosure.

FIG. 1 is an illustration of an example mobile device 1, in accordance with embodiments of the present disclosure. FIG. 1 depicts mobile device 1 coupled to a headset 3 in the form of a pair of earbud speakers 8A and 8B. Headset 3 depicted in FIG. 1 is merely an example, and it is understood that mobile device 1 may be used in connection with a variety of audio transducers, including without limitation, headphones, earbuds, in-ear earphones, and external speakers. A plug 4 may provide for connection of headset 3 to an electrical terminal of mobile device 1. Mobile device 1 may provide a display to a user and receive user input using a touch screen 2, or alternatively, a standard liquid crystal display (LCD) may be combined with various buttons, sliders, and/or dials disposed on the face and/or sides of mobile device 1. As also shown in FIG. 1, mobile device 1 may include an audio integrated circuit (IC) 9 for generating an analog audio signal for transmission to headset 3, a loudspeaker 7, and/or another audio transducer.

Figure 2:
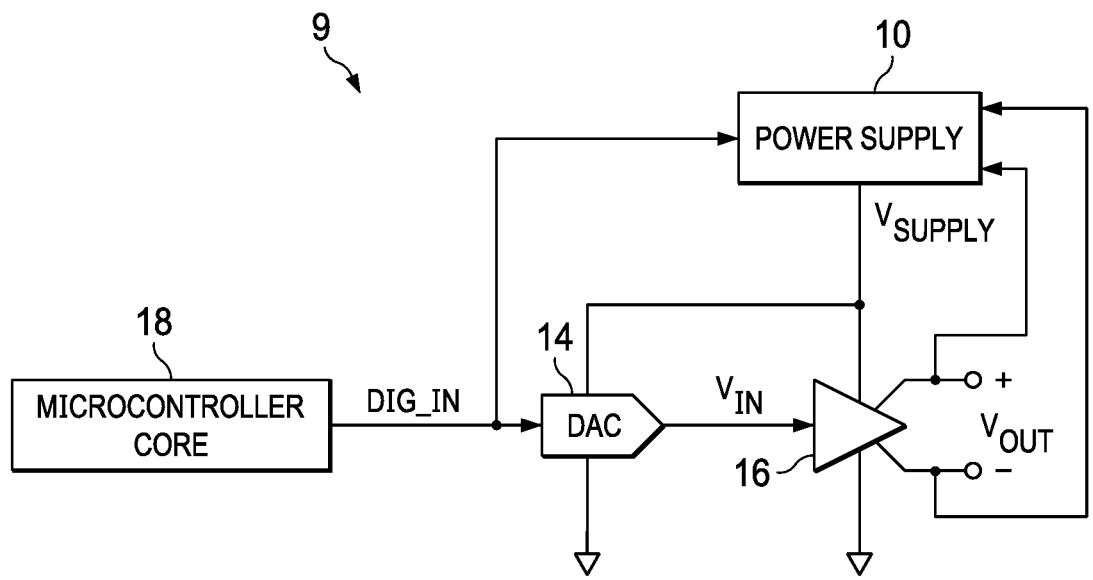
FIG. 2 is a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier 16 which may amplify or attenuate audio input signal $V_{IN}$ to provide a differential audio output signal $V_{OUT}$, which may operate a speaker, a headphone transducer, a line level signal output, and/or other suitable output. In some embodiments, DAC 14 may be an integral component of amplifier 16. A power supply 10 may provide the power supply rail inputs of microcontroller core 18, DAC 14, and/or other components of audio IC 9. In some embodiments, power supply 10 may comprise a switched-mode power converter, as described in greater detail below. Although FIGS. 1 and 2 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure. Further, the systems and methods described herein are not limited to mobile audio devices, and may also be used in video game controllers, touchscreens, automobiles, and any other device for which audio and/or haptic output is desirable.

Figure 3:
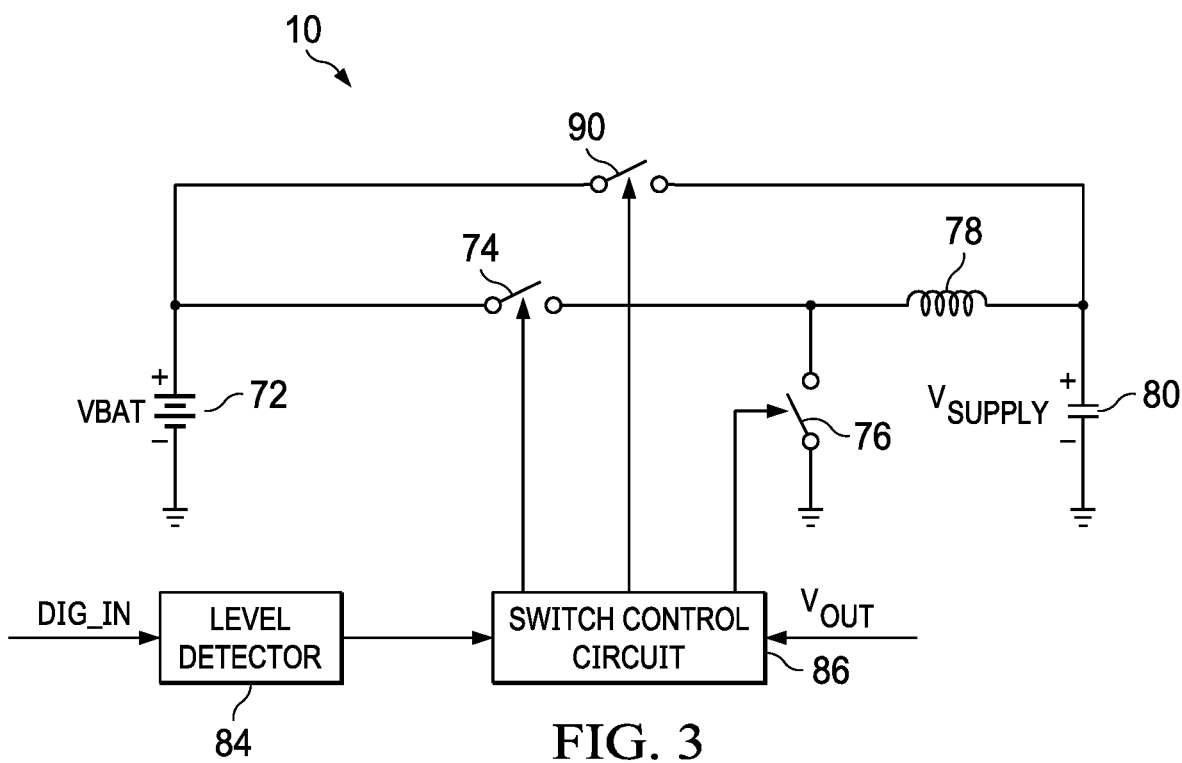
FIG. 3 is a circuit diagram of selected components of an example switched-mode power supply, in accordance with embodiments of the present disclosure.

FIG. 3 is a circuit diagram of selected components of an example switched-mode power supply 10, in accordance with embodiments of the present disclosure. In some embodiments, switched-mode power supply 10 shown in FIG. 3 may be used to implement switched-mode power supply 10 of FIG. 2.

As shown in FIG. 3, switched-mode power supply 10 may be implemented as a buck power converter comprising a battery 72, a power inductor 78, converter switches 74 and 76, a buck capacitor 80, a level detector 84, a bypass switch 90, and a switch control circuit 86. In operation, level detector 84 may receive digital audio input signal DIG_IN, audio output signal $V_{OUT}$, and/or another signal indicative of audio output signal $V_{OUT}$, and based on a detected signal level and/or time-rate-of-change of such detected signal level (e.g., slope of such detected signal level), switch control circuit 86 may cyclically commutate converter switches 74 and 76 to generate supply voltage $V_{SUPPLY}$ across buck capacitor 80 smaller than battery voltage $V_{BAT}$ of battery 72, such supply voltage $V_{SUPPLY}$ being a minimal magnitude that is of sufficient headroom to ensure linear and accurate operation of current DAC 14 (e.g., a Class-H amplifier). For example, switch control circuit 86 may vary one or both of a switching frequency and a duty cycle of switched-mode power supply 10 in order to generate supply voltage $V_{SUPPLY}$.

A current source integral to DAC 14 may require a sufficient voltage drop across it to operate accurately, wherein such sufficient voltage drop may also be referred to as a voltage headroom. To create sufficient voltage headroom while minimizing power consumption, switched-mode power supply 10 may track output signal $V_{OUT}$ (e.g., by tracking digital audio input signal DIG_IN, which may be indicative of output signal $V_{OUT}$) to generate a supply voltage $V_{SUPPLY}$ sufficient to allow for linear and accurate operation of current-mode DAC 14, while maintaining a supply voltage $V_{SUPPLY}$ as small in magnitude as possible. The amount of headroom generated by switched-mode power supply 10 may be optimized for efficiency or audio accuracy, and such optimization may be varied dynamically, for example, based on program material, volume control setting, environmental noise, and/or a noise cancellation setting.

In implementation, some or all components of audio IC 9, including power inductor 78, other components of switched-mode power supply 10, and amplifier 16, may be formed on a single integrated circuit die. Having power inductor 78 integrated on a single integrated circuit die with other components of switched-mode power supply 10 and amplifier 16 may enable a fast switching frequency for switched-mode power supply 10, which may enable supply voltage $V_{SUPPLY}$ to track audio output signal $V_{OUT}$ over full audio bandwidth. For an even faster loop response for control of supply voltage $V_{SUPPLY}$, switch control circuit 86 may be configured to operate switched-mode power supply 10 in a discontinuous conduction mode (e.g., in a mode in which electrical current through power inductor 78 is zero for a period of a switching cycle of switched-mode power supply 10).

Forming some or all of audio IC 9 on a single integrated circuit die, including power inductor 78, other components of switched-mode power supply 10, and amplifier 16, may have one or more advantages. For example, using a single integrated circuit die, switched-mode power supply 10 may operate at switching frequencies of 10 megahertz and above, including 20 megahertz or more. With a 20-megahertz switching frequency, switched-mode power supply 10 may effectively track 20-kilohertz audio signals amplified by amplifier 16, enabling a high level of power efficiency and enabling adequate headroom and low audio distortion.

As shown in FIG. 3, in some embodiments, switch control circuit 86 may activate (e.g., turn on, enable, close) bypass switch 90 to bypass battery voltage $V_{BAT}$ to supply voltage $V_{SUPPLY}$. For example, such bypass may occur when the switching frequency of switched-mode power supply 10 is insufficient to track the signal frequency of audio output signal $V_{OUT}$. As another example, if audio output signal $V_{OUT}$ is close in magnitude to battery voltage $V_{BAT}$, switch control circuit 86 may activate bypass switch 90 in order to maximize converter efficiency.

As shown in FIG. 3, switch control circuit 86 may control switching frequency and/or duty cycle of converter switches 74 and 76 and operation of bypass switch 90 in a feedforward operation (e.g., based on digital audio input signal DIG_IN), a feedback operation (e.g., based on output signal $V_{OUT}$), or a combination thereof. For example, in some embodiments, a hybrid approach may be used in which feedforward operation may be used to determine switching frequency of converter switches 74 and 76 based on signal power estimation, and the feedback operation may be used to control duty cycle based on comparison of supply voltage $V_{SUPPLY}$ to a reference. As another example, in other embodiments, feedback operation may be used to control duty cycle until a duty cycle limit is used, and then the feedforward operation may be used to control switching frequency of converter switches 74 and 76 once such duty cycle limit is reached.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A single integrated circuit die, comprising:
    a signal path configured to generate an output signal from an input signal, wherein the signal path includes an amplifier configured to drive the output signal;
    a direct-current-to-direct-current (DC-DC) power converter having power switches and a power inductor integrated in the single integrated circuit die and configured to generate a supply voltage to the amplifier from a source voltage to the DC-DC power converter; and
    control circuitry for controlling operation of converter switches of the DC-DC power converter in order that the supply voltage tracks at least one among the input signal and the output signal.

2. The single integrated circuit die of claim 1, wherein the control circuitry is configured to control operation of the converter switches only in a discontinuous current mode of the DC-DC power converter.

3. The single integrated circuit die of claim 1, wherein:
    the DC-DC power converter comprises a bypass switch configured to bypass operation of the converter switches; and
    the control circuitry is configured to control the bypass switch to bypass the source voltage to the supply voltage.

4. The single integrated circuit die of claim 3, wherein the control circuitry is configured to cause the bypass switch to bypass the source voltage to the supply voltage when one of the input signal and the output signal is above a threshold magnitude.

5. The single integrated circuit die of claim 3, wherein the control circuitry is configured to cause the bypass switch to bypass the source voltage to the supply voltage when a bandwidth of the DC-DC power converter is insufficient to allow the supply voltage to track the at least one among the input signal and the output signal.

6. The single integrated circuit die of claim 1, wherein the control circuitry is configured to control at least one among a duty cycle and a switching frequency of the DC-DC power converter based on the at least one among the input signal and the output signal.

7. The single integrated circuit die of claim 1, wherein the control circuitry is configured to:
    control a duty cycle of the DC-DC power converter based on the input signal; and
    control a switching frequency of the DC-DC power converter based on the output signal.

8. The single integrated circuit die of claim 1, wherein the control circuitry is configured to:
    control a duty cycle of the DC-DC power converter based on the at least one among the input signal and the output signal until the duty cycle reaches a duty cycle limit; and
    control a switching frequency of the DC-DC power converter based on the at least one among the input signal and the output signal when the duty cycle is at the duty cycle limit.

9. A method comprising, in a single integrated circuit die:
    generating an output signal from an input signal in a signal path, wherein the signal path includes an amplifier configured to drive the output signal;
    generating a supply voltage to the amplifier from a source voltage to a direct-current-to-direct-current (DC-DC) power converter, wherein the DC-DC power converter has converter switches and a power inductor integrated in the single integrated circuit die; and
    controlling operation of converter switches of the DC-DC power converter with control circuitry in order that the supply voltage tracks at least one among the input signal and the output signal.

10. The method of claim 9, further comprising controlling operation of the converter switches only in a discontinuous current mode of the DC-DC power converter.

11. The method of claim 9, wherein:
    the DC-DC power converter comprises a bypass switch configured to bypass operation of the converter switches; and
    the method further comprises controlling the bypass switch to bypass the source voltage to the supply voltage.

12. The method of claim 11, further comprising causing the bypass switch to bypass the source voltage to the supply voltage when one of the input signal and the output signal is above a threshold magnitude.

13. The method of claim 11, further comprising causing the bypass switch to bypass the source voltage to the supply voltage when a bandwidth of the DC-DC power converter is insufficient to allow the supply voltage to track the at least one among the input signal and the output signal.

14. The method of claim 9, further comprising controlling at least one among a duty cycle and a switching frequency of the DC-DC power converter based on the at least one among the input signal and the output signal.

15. The method of claim 9, further comprising:
controlling a duty cycle of the DC-DC power converter based on the input signal; and
controlling a switching frequency of the DC-DC power converter based on the output signal.

16. The method of claim 9, further comprising:
controlling a duty cycle of the DC-DC power converter based on the at least one among the input signal and the output signal until the duty cycle reaches a duty cycle limit; and
controlling a switching frequency of the DC-DC power converter based on the at least one among the input signal and the output signal when the duty cycle is at the duty cycle limit.

* * * * *